United States Patent
Lee et al.

(10) Patent No.: US 10,297,594 B2
(45) Date of Patent: May 21, 2019

(54) HIGH DENSITY MOSFET ARRAY WITH SELF-ALIGNED CONTACTS DELIMITED BY NITRIDE-CAPPED TRENCH GATE STACKS AND METHOD

(71) Applicant: Alpha and Omega Semiconductor Incorporated, Sunnyvale, CA (US)

(72) Inventors: Yeeheng Lee, San Jose, CA (US); Jongoh Kim, Portland, OR (US); Hong Chang, Saratoga, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/820,482

(22) Filed: Aug. 6, 2015

(65) Prior Publication Data
US 2015/0340363 A1  Nov. 26, 2015

Related U.S. Application Data

(62) Division of application No. 13/794,628, filed on Mar. 11, 2013, now Pat. No. 9,136,377.

(51) Int. Cl.
*H01L 29/45* (2006.01)
*H01L 29/49* (2006.01)
(Continued)

(52) U.S. Cl.
CPC .......... *H01L 27/088* (2013.01); *H01L 23/535* (2013.01); *H01L 23/53266* (2013.01);
(Continued)

(58) Field of Classification Search
CPC ......... H01L 29/42368; H01L 29/66719; H01L 29/7813; H01L 29/66727; H01L 29/66734;
(Continued)

(56) References Cited

U.S. PATENT DOCUMENTS

2004/0173844 A1* 9/2004 Williams ............ H01L 29/4236
257/329
2007/0267691 A1 11/2007 Chen et al.
(Continued)

FOREIGN PATENT DOCUMENTS

TW       200744125     12/2007

OTHER PUBLICATIONS

EPO biliographic data for CN104051461.*
(Continued)

*Primary Examiner* — Yu Chen
*Assistant Examiner* — Vincent Wall
(74) *Attorney, Agent, or Firm* — Chein-Hwa Tsao; Lance Ang Li; Chen-Chi Lin

(57) ABSTRACT

A high density trench-gated MOSFET array and method are disclosed. It comprises semiconductor substrate partitioned into MOSFET array area and gate pickup area; epitaxial region, body region and source region; numerous precisely spaced active nitride-capped trench gate stacks (ANCTGS) embedded till the epitaxial region. Each ANCTGS comprises a stack of polysilicon trench gate with gate oxide shell and silicon nitride cap covering top of polysilicon trench gate and laterally registered to gate oxide shell. The ANCTGS forms, together with the source, body, epitaxial region, a MOSFET device in the MOSFET array area. Over MOSFET array area and gate pickup area, a patterned dielectric region atop the MOSFET array and a patterned metal layer atop the patterned dielectric region. Thus, the patterned metal layer forms, with the MOSFET array and the gate pickup area, self-aligned source and body contacts through the inter-ANCTGS separations.

14 Claims, 18 Drawing Sheets

(51) Int. Cl.
*H01L 29/66* (2006.01)
*H01L 29/78* (2006.01)
*H01L 23/532* (2006.01)
*H01L 23/535* (2006.01)
*H01L 27/088* (2006.01)
*H01L 29/417* (2006.01)
*H01L 29/423* (2006.01)

(52) U.S. Cl.
CPC .... *H01L 29/4236* (2013.01); *H01L 29/42368* (2013.01); *H01L 29/4916* (2013.01); *H01L 29/66666* (2013.01); *H01L 29/66719* (2013.01); *H01L 29/66727* (2013.01); *H01L 29/66734* (2013.01); *H01L 29/7813* (2013.01); *H01L 29/7827* (2013.01); *H01L 29/41766* (2013.01); *H01L 29/456* (2013.01); *H01L 2924/0002* (2013.01)

(58) Field of Classification Search
CPC ... H01L 29/4236; H01L 29/4916–4941; H01L 21/28035–28061
See application file for complete search history.

(56) References Cited

U.S. PATENT DOCUMENTS

| | | | | |
|---|---|---|---|---|
| 2009/0309156 A1* | 12/2009 | Darwish | ........... | H01L 29/41766 257/332 |
| 2010/0019314 A1* | 1/2010 | Kachi | ............... | H01L 29/42372 257/330 |
| 2011/0254086 A1 | 10/2011 | Hsieh | | |
| 2011/0291186 A1* | 12/2011 | Yilmaz | ............... | H01L 29/4236 257/334 |
| 2012/0037954 A1* | 2/2012 | Hshieh | ................ | H01L 29/0638 257/139 |

OTHER PUBLICATIONS

IPADOC patent family for the current applicaiton.*
EPO Dossier for CN104051461 (CN application 201410065223).*
English tranlsation of CN application 201410065223 office action.*
Chinese version of CN application 201410065223 office action.*
CN 201410065226.X translated office action dated Jun. 1, 2016.*
CN 201510079863.7 translated office action dated May 27, 2017.*
CN 201510079863.7 translated office action dated Nov. 6, 2017.*
Office Action dated Jun. 1, 2016 for CN201410065226 from Intellectual Property Office of the People's Republic of China.
Office Action dated Mar. 7, 2016 for TW103107875 from TW Patent Office.
Office Action dated May 27, 2017 for CN201510079863 from Intellectual Property Office of the People's Republic of China.
Office Action dated Nov. 11, 2017 for CN201510079863 from Intellectual Property Office of the People's Republic of China.
Office Action dated Mar. 1, 2016 for TW104107067 from TW Patent Office.
Summary of foreign OAs of Jun. 27, 2018 by Alpha and Omega Semiconductor Incorporated.

* cited by examiner

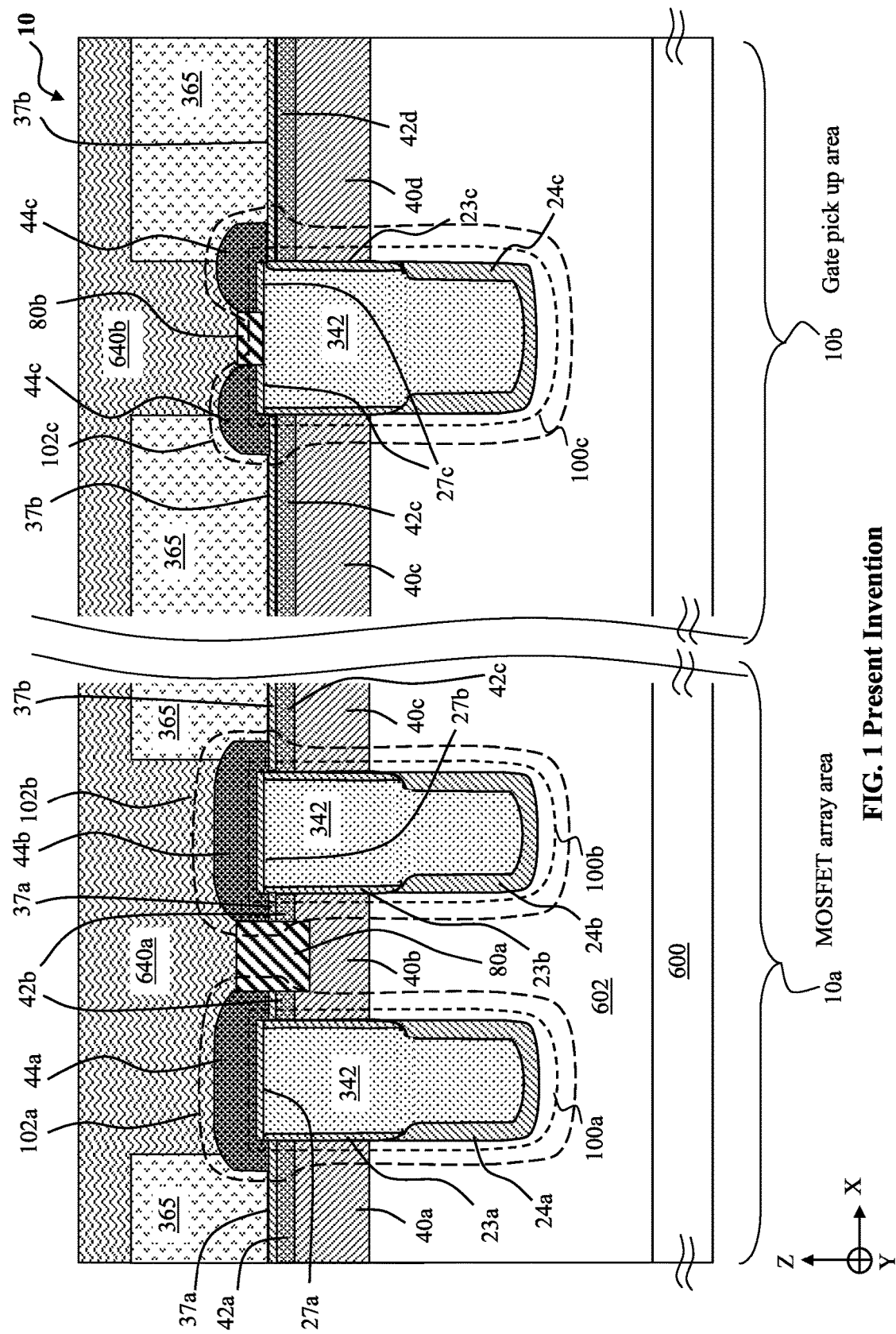
FIG. 1 Present Invention

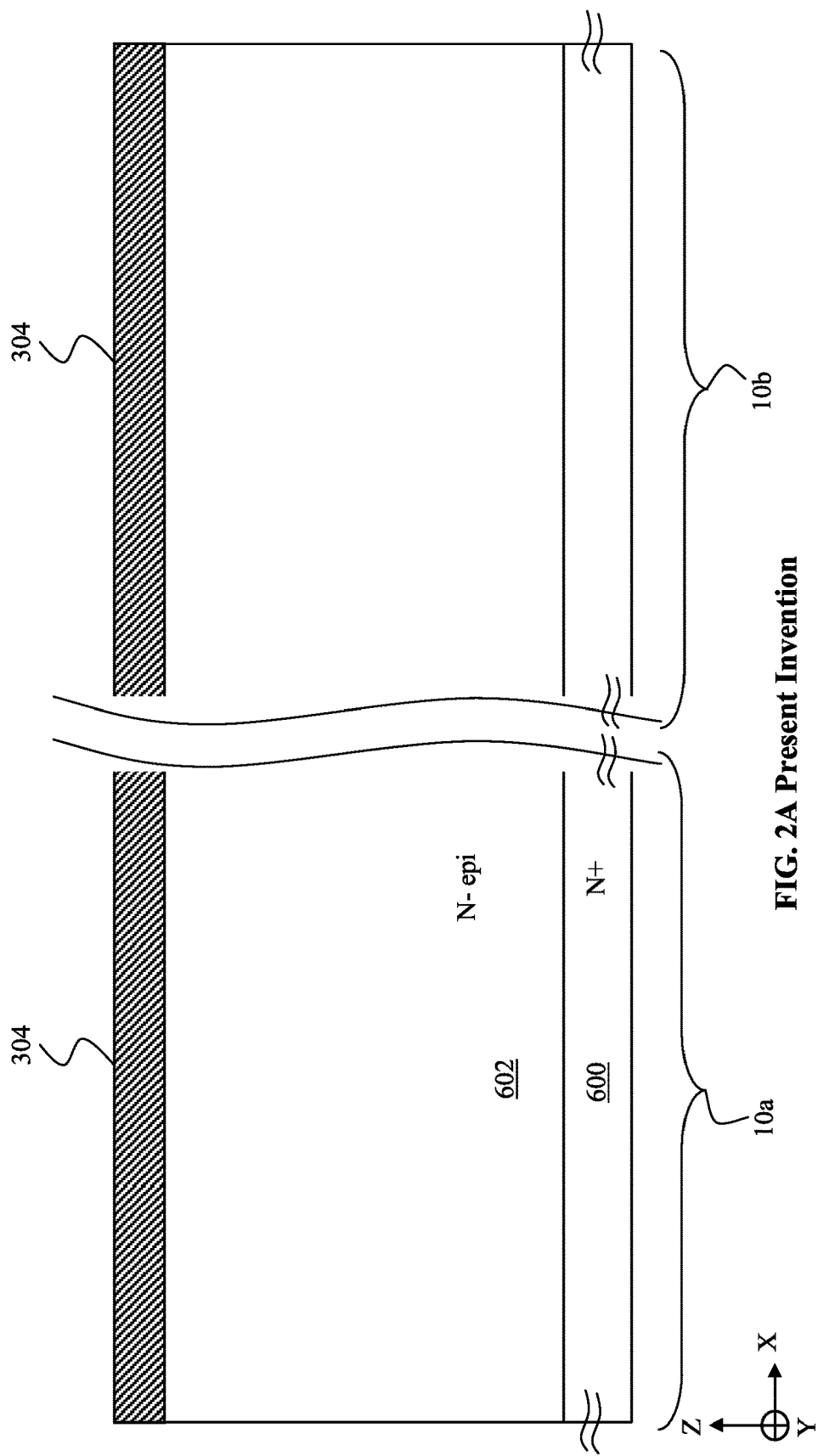
FIG. 2A Present Invention

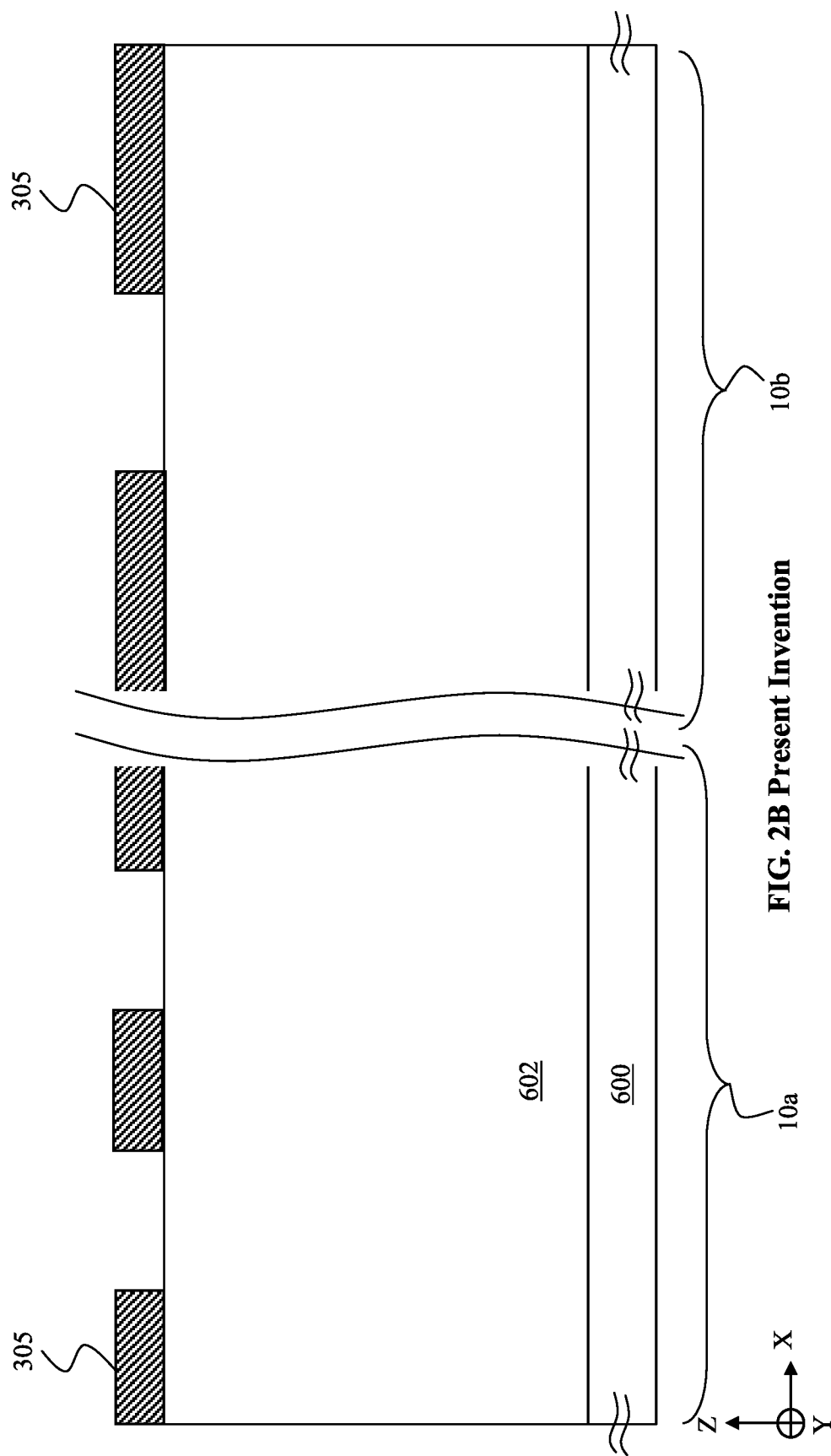
FIG. 2B Present Invention

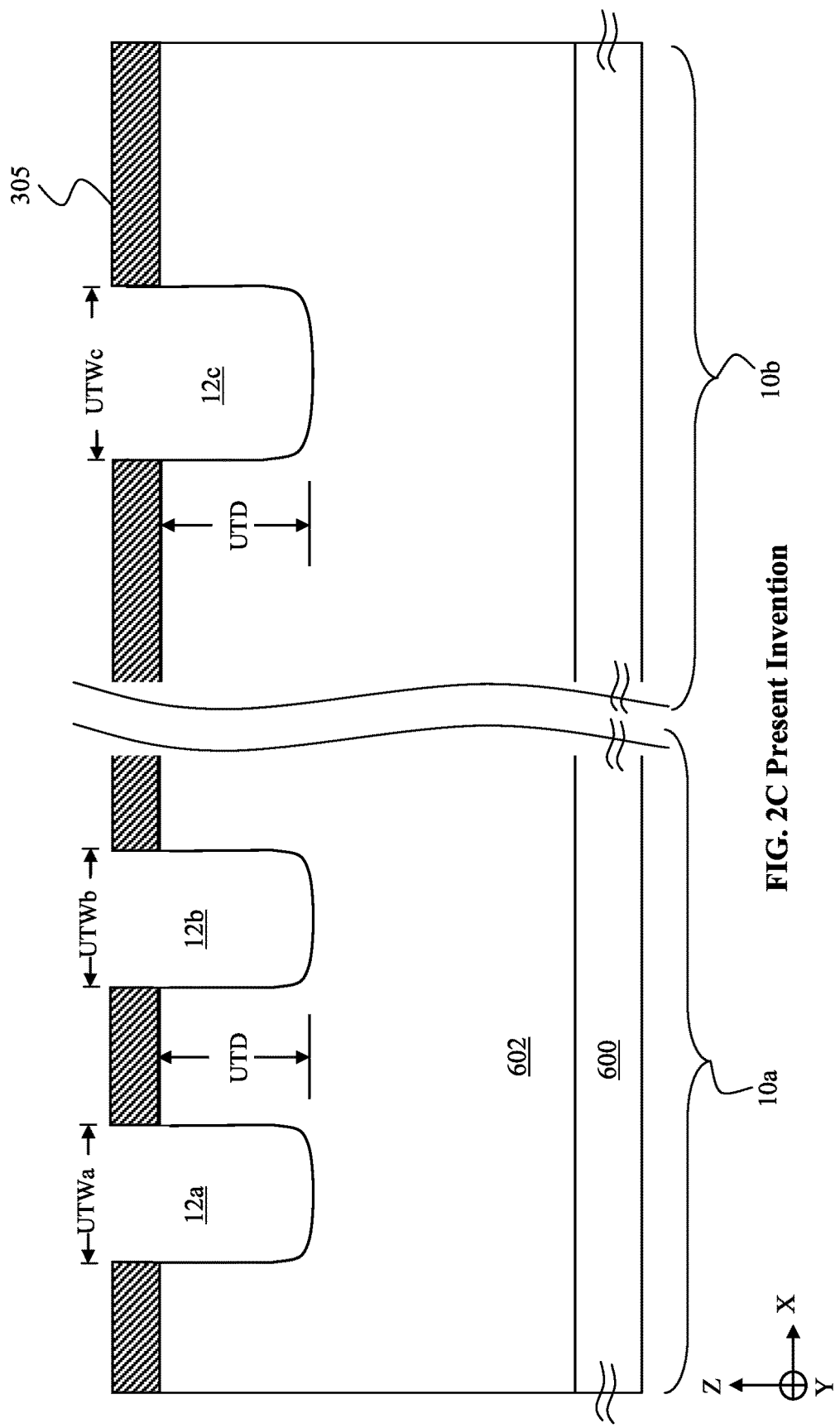
FIG. 2C Present Invention

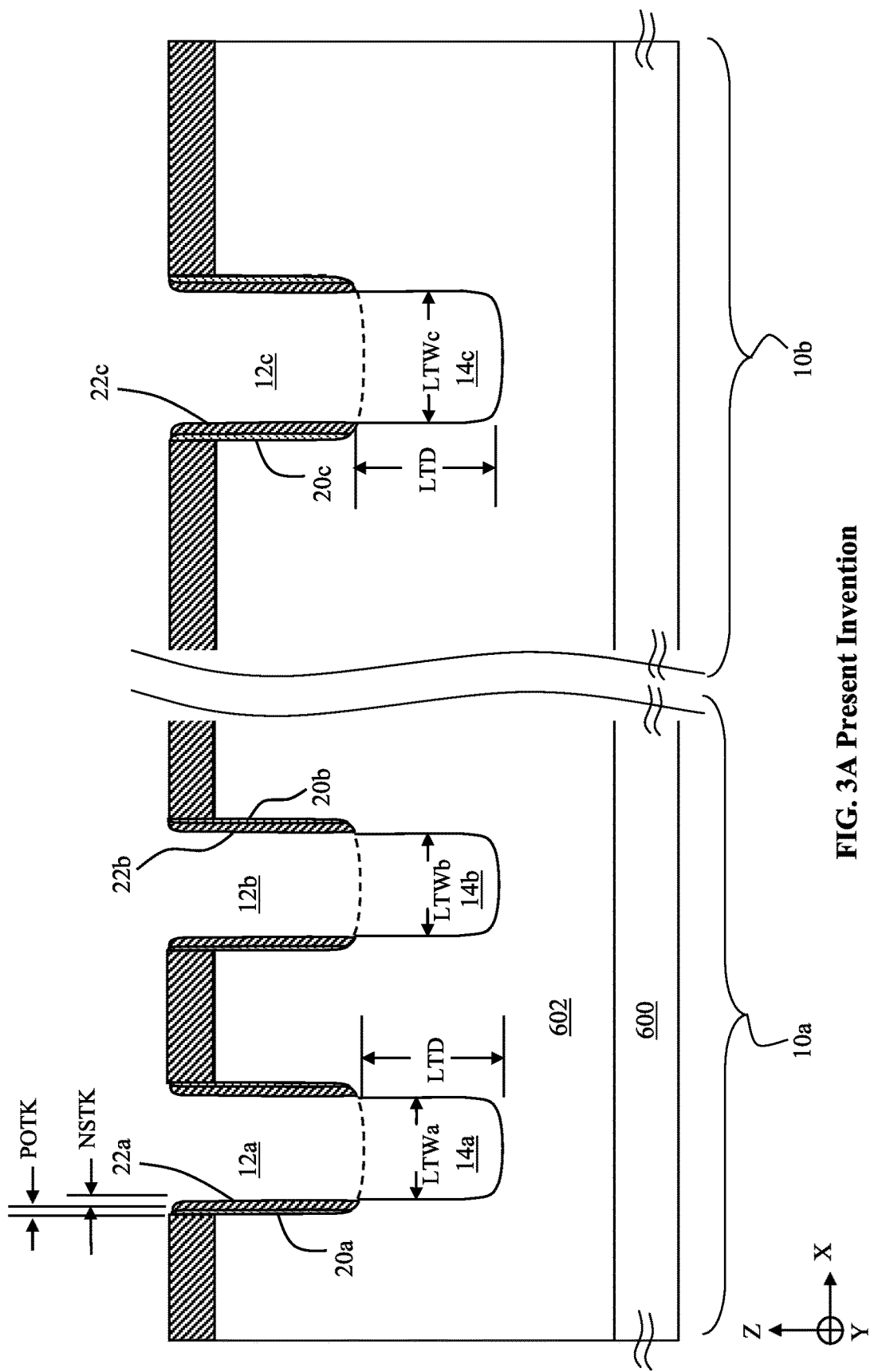
FIG. 3A Present Invention

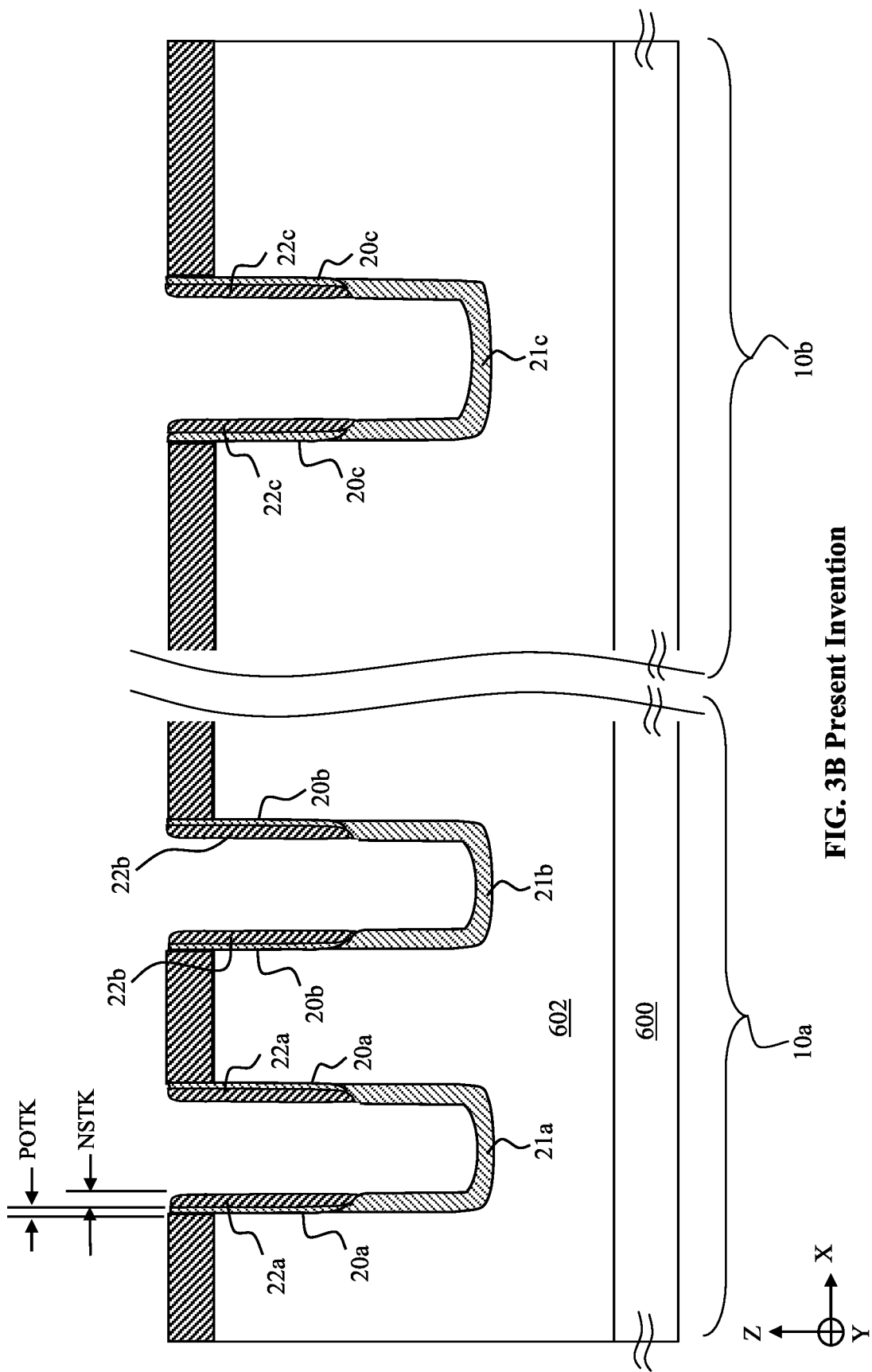
FIG. 3B Present Invention

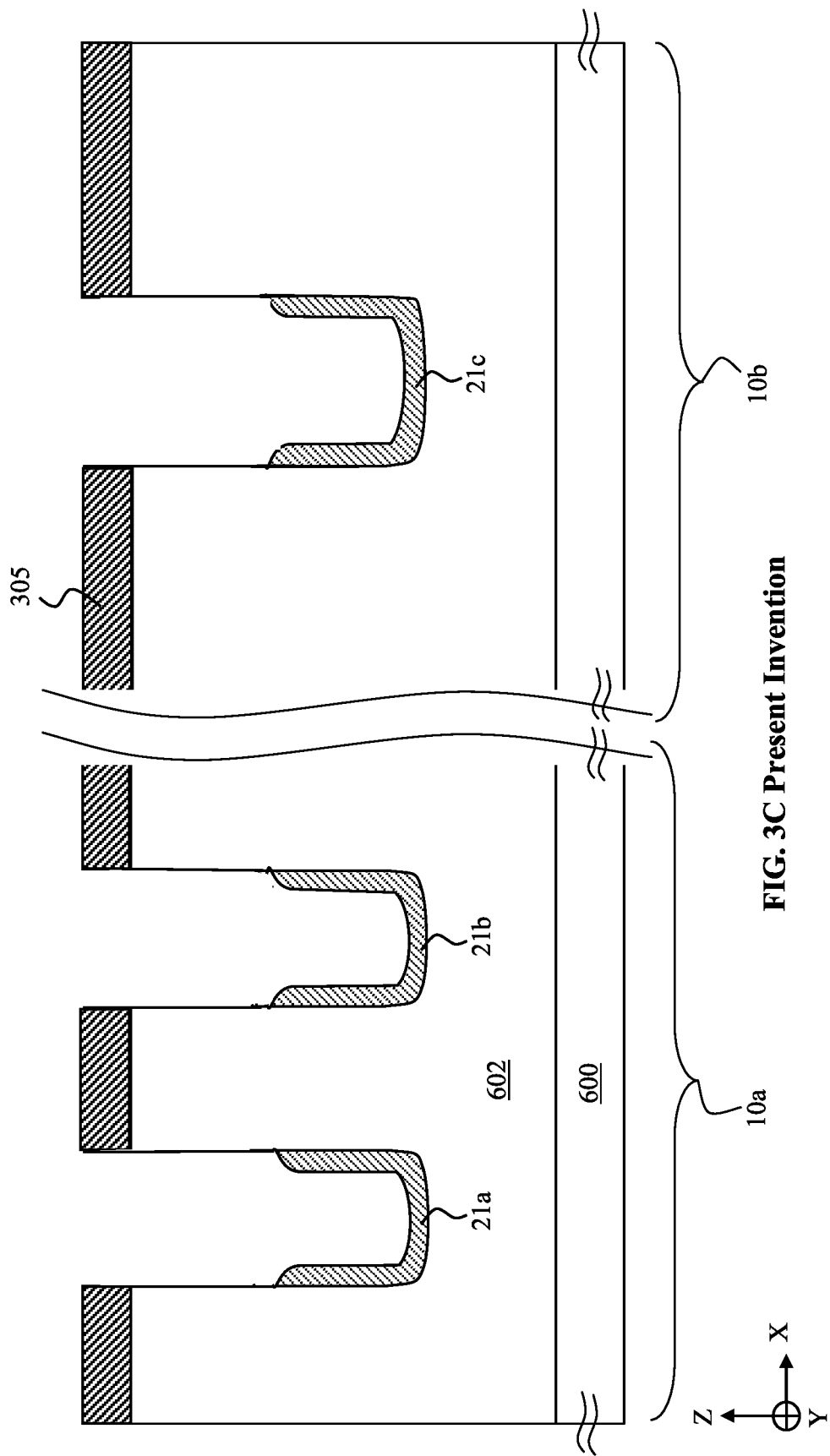
FIG. 3C Present Invention

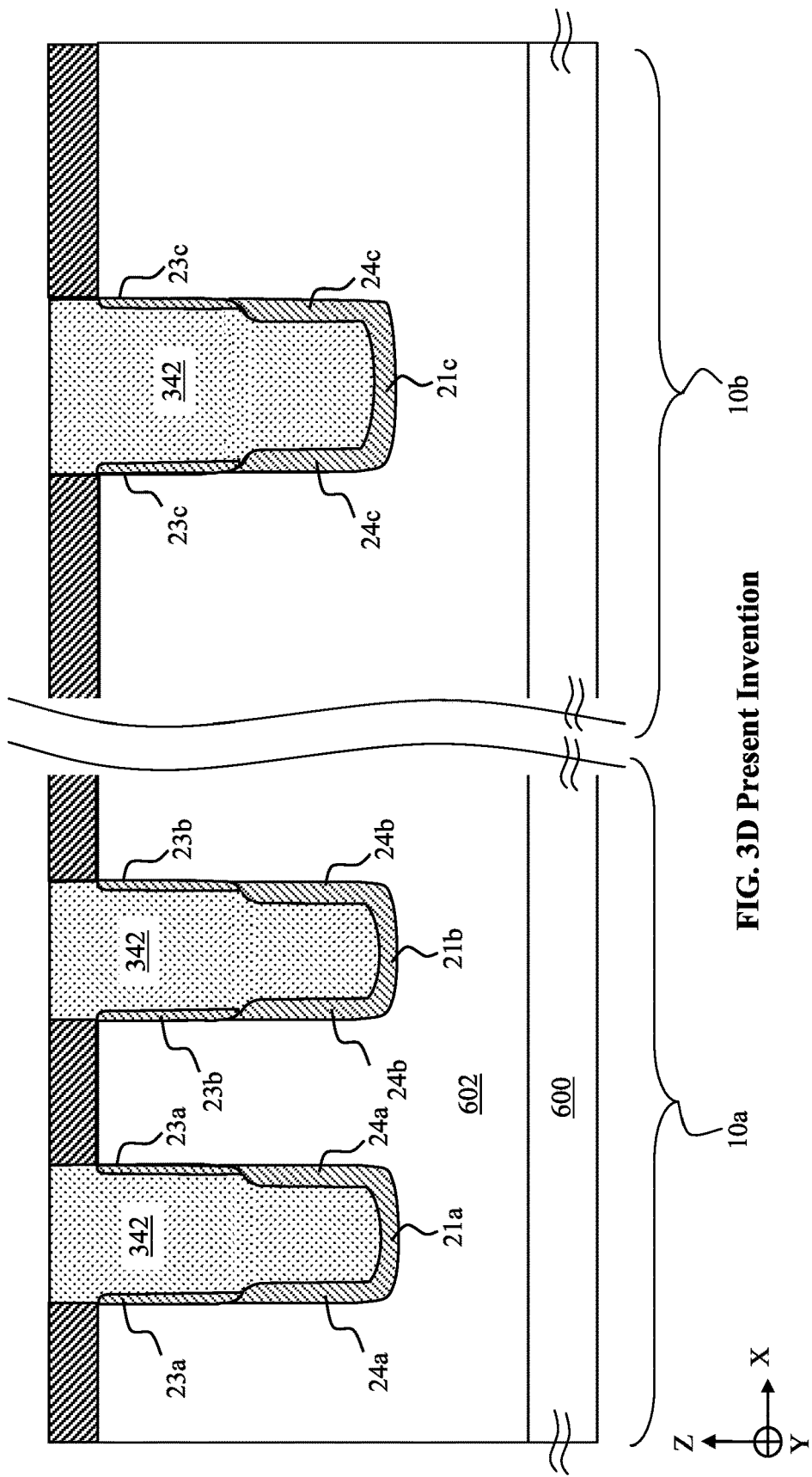
FIG. 3D Present Invention

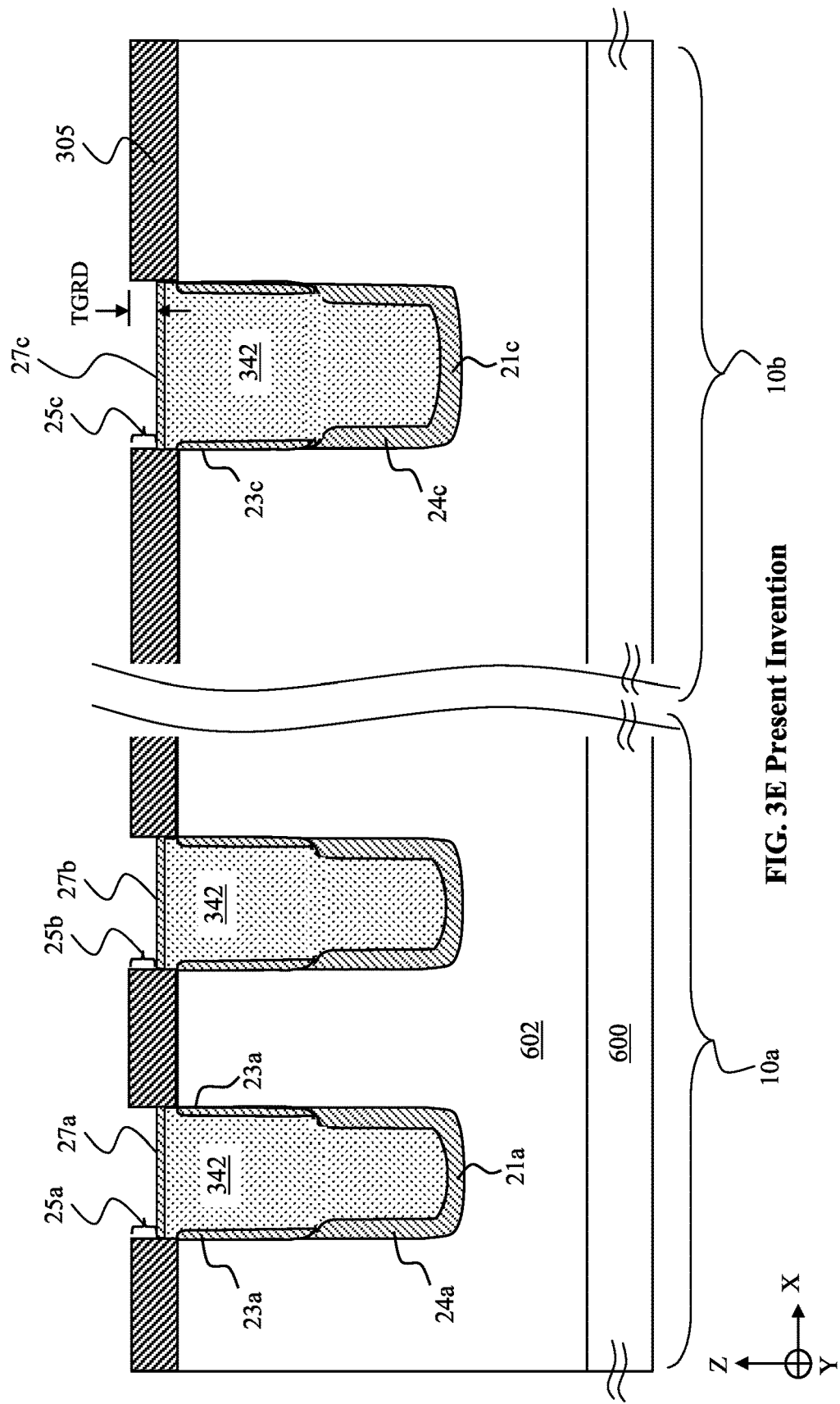
FIG. 3E Present Invention

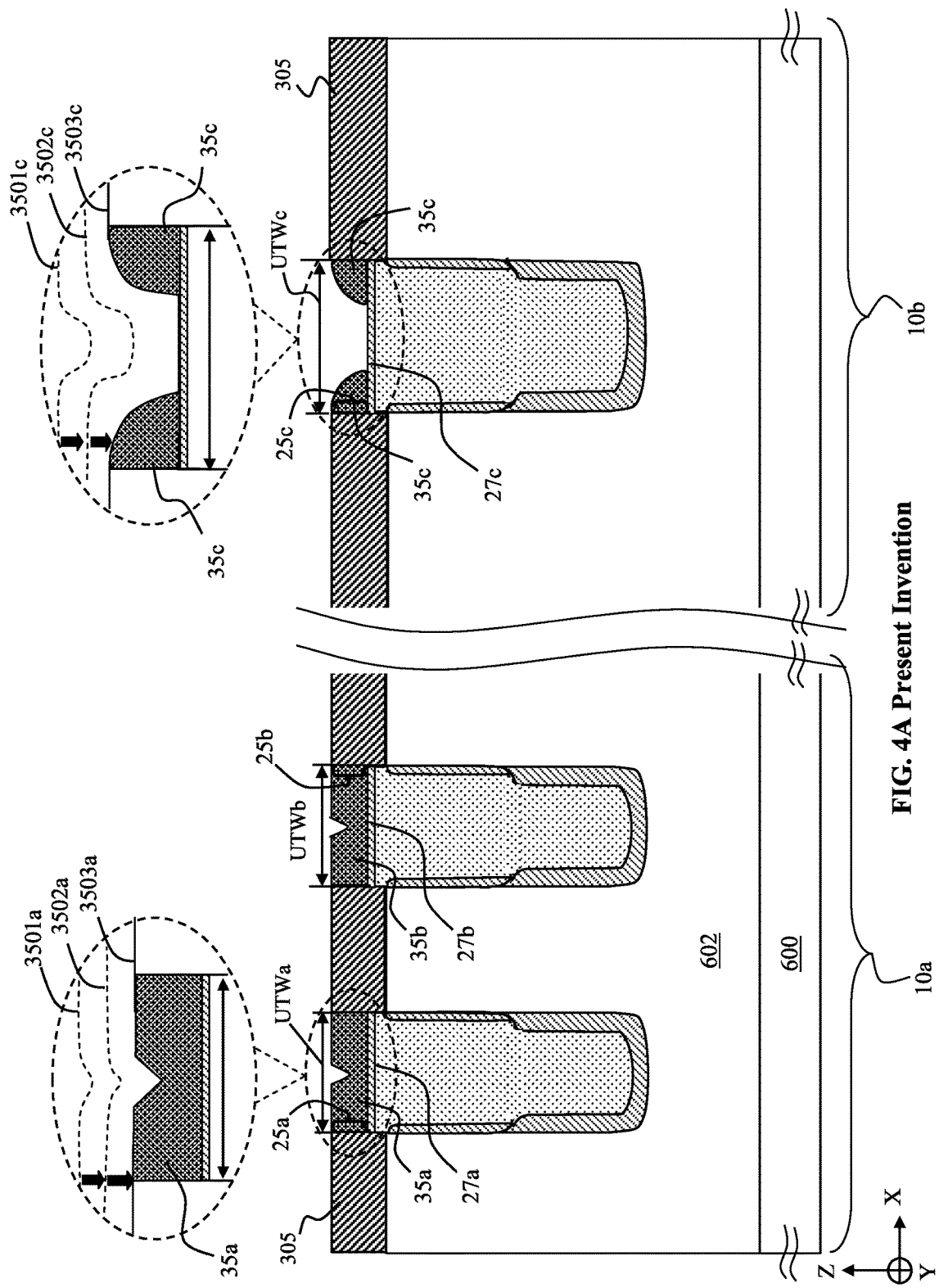
FIG. 4A Present Invention

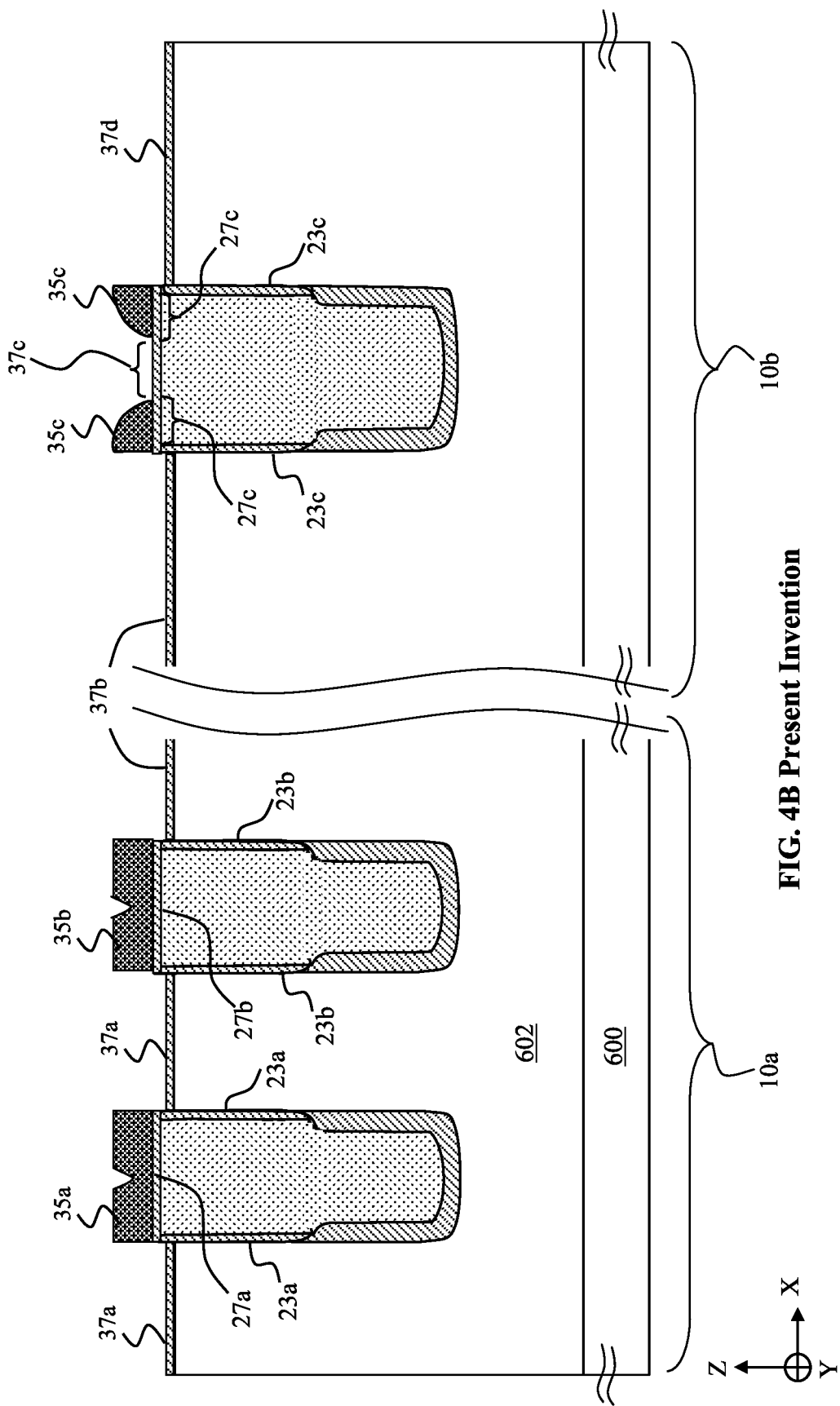
FIG. 4B Present Invention

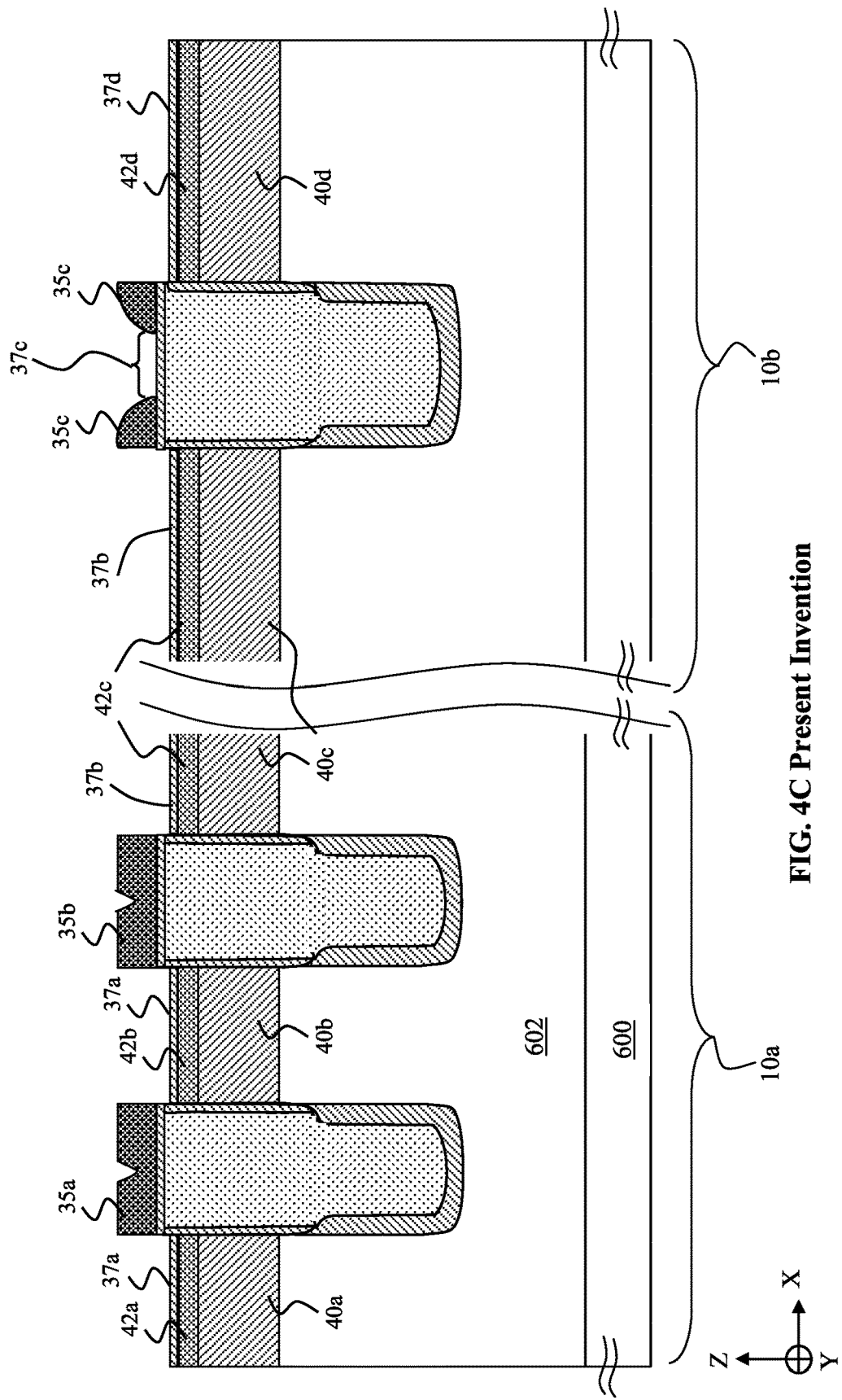
FIG. 4C Present Invention

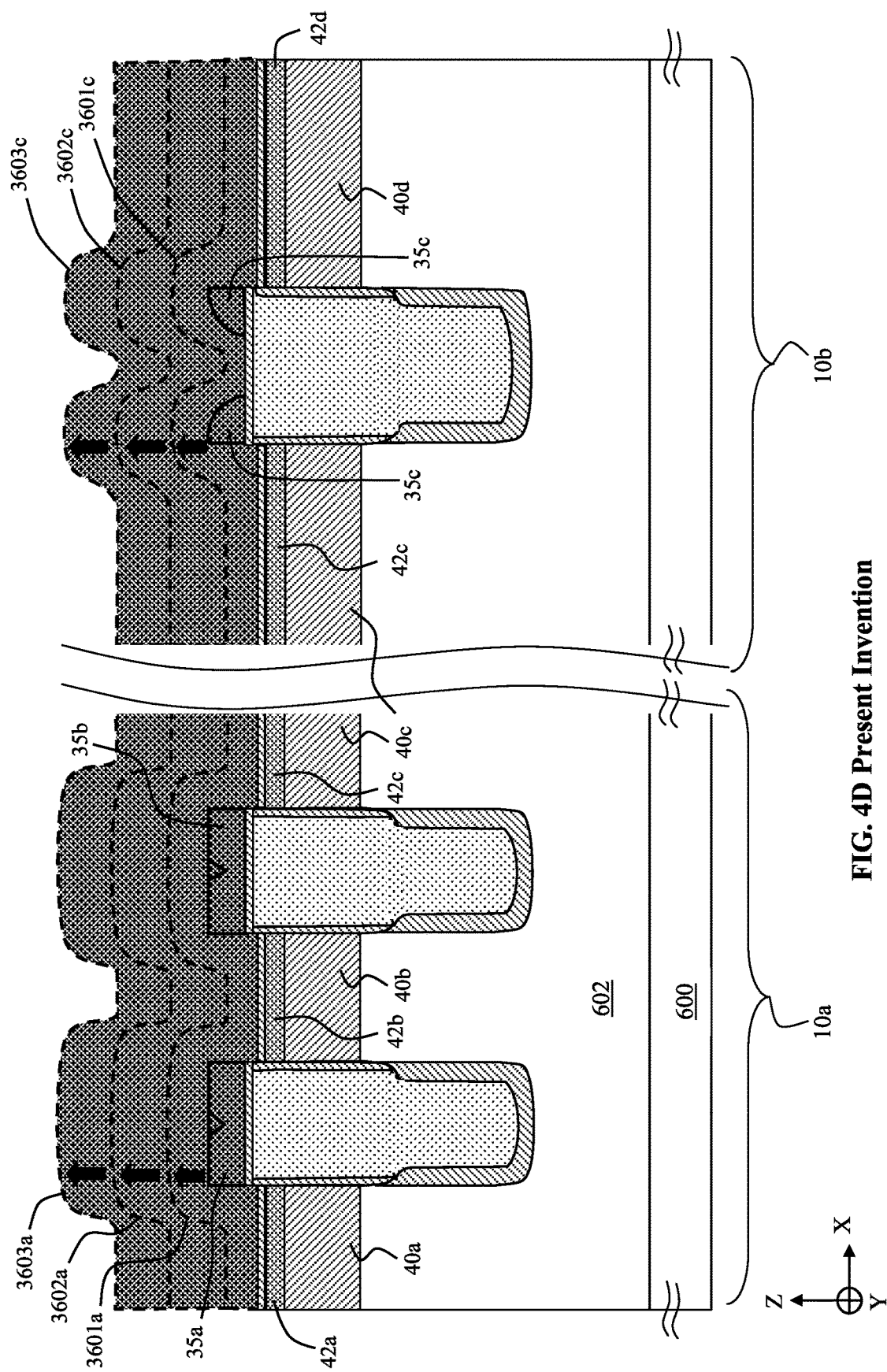
FIG. 4D Present Invention

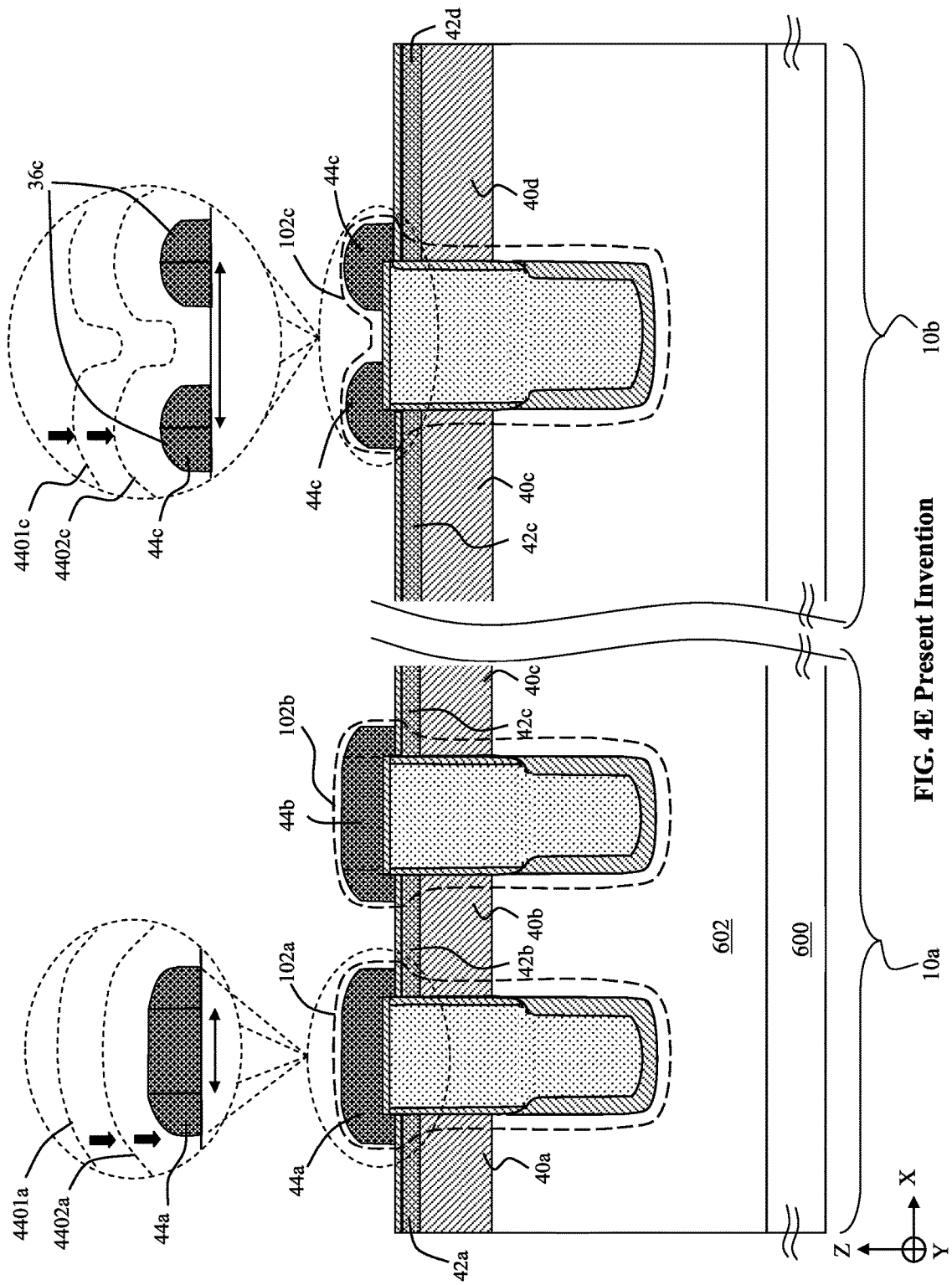
FIG. 4E Present Invention

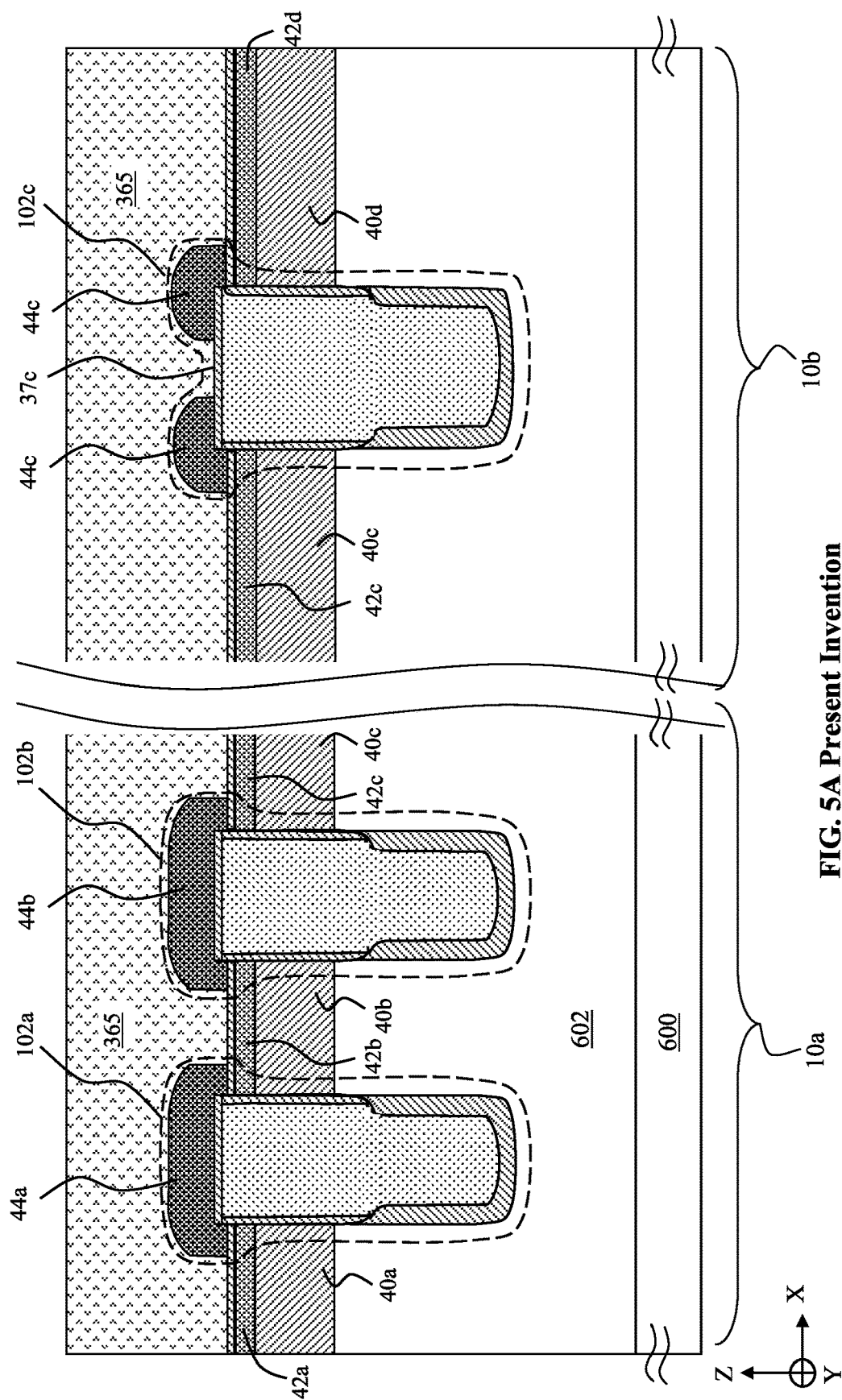
FIG. 5A Present Invention

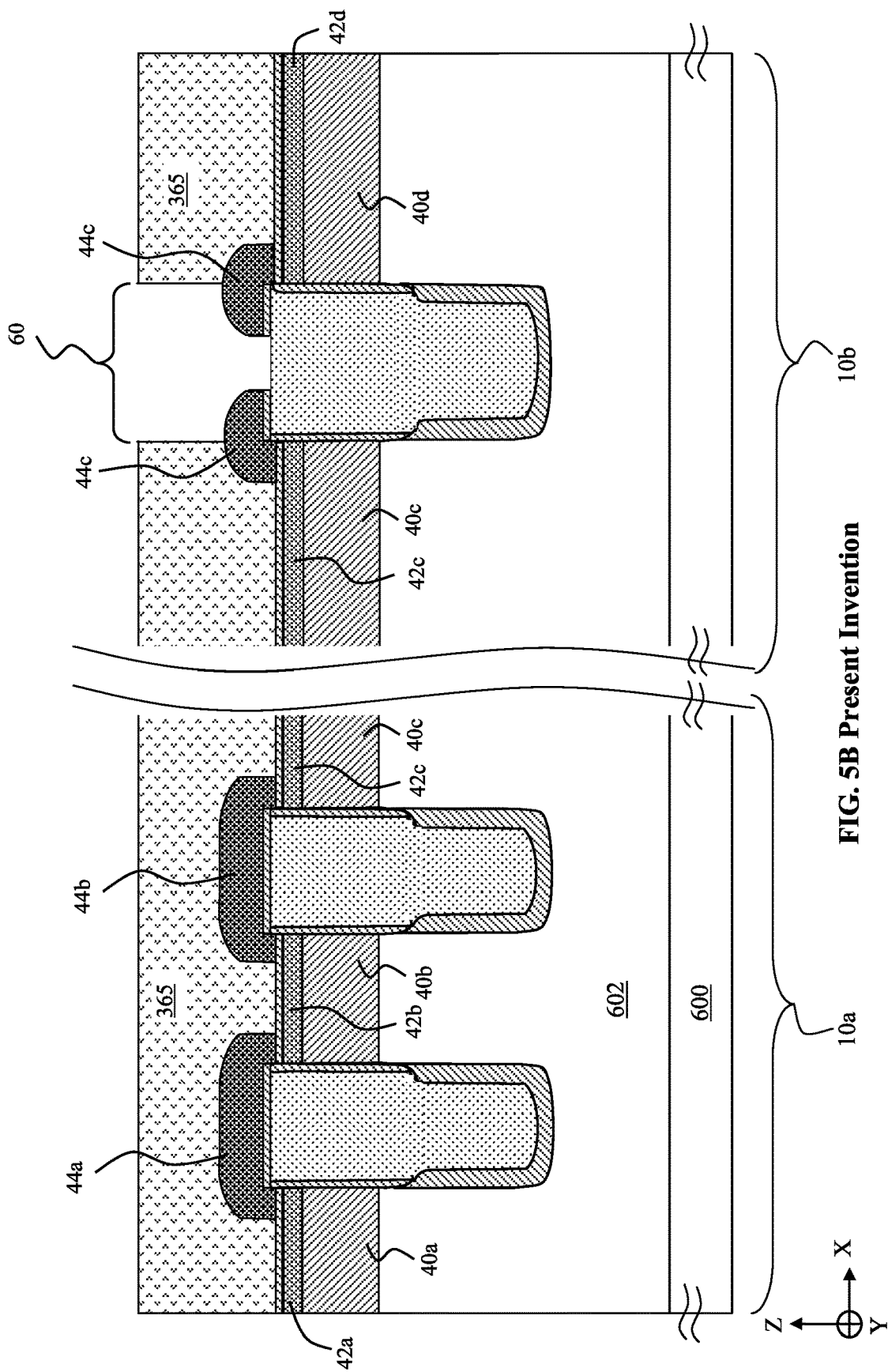
FIG. 5B Present Invention

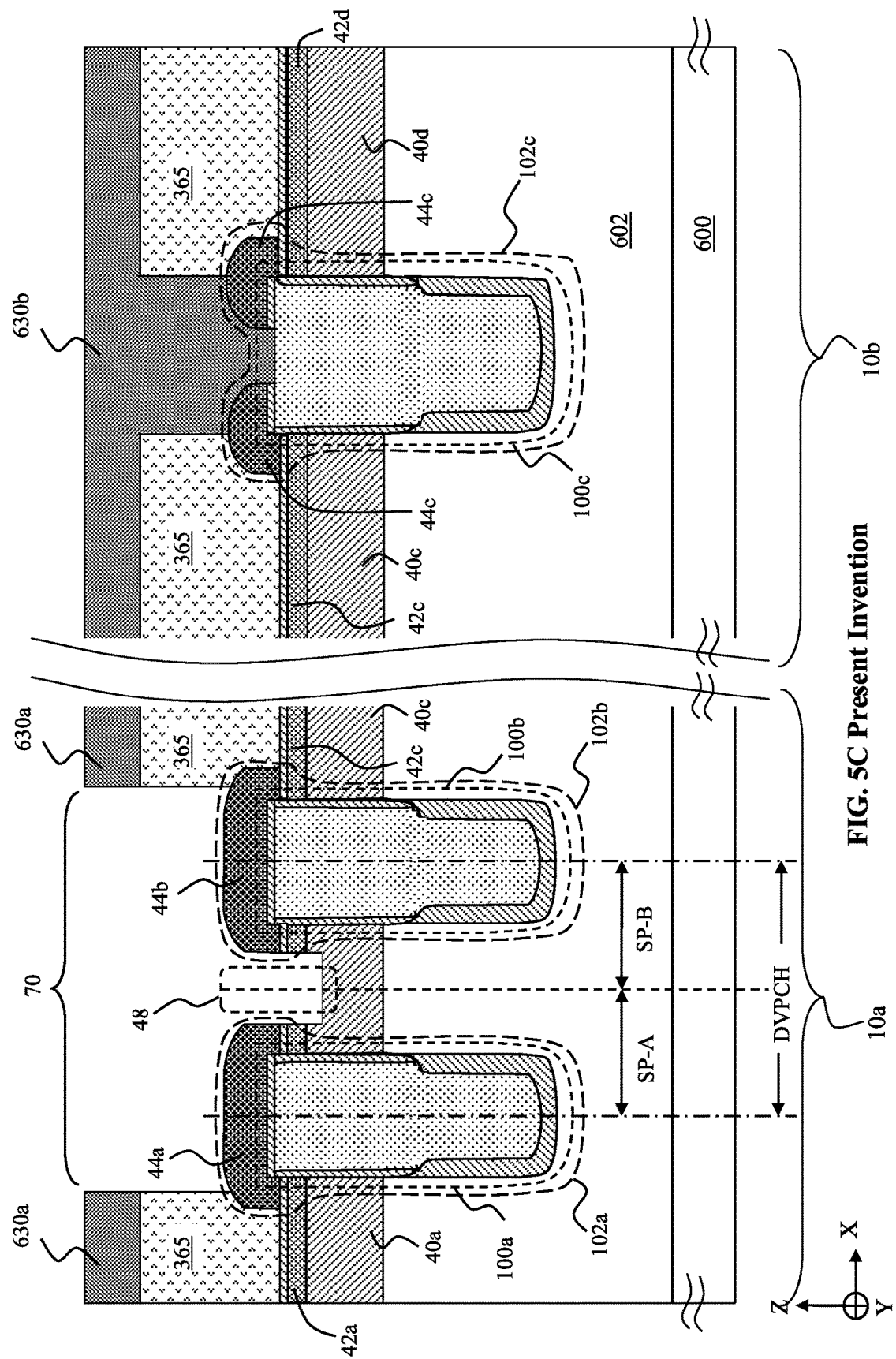
FIG. 5C Present Invention

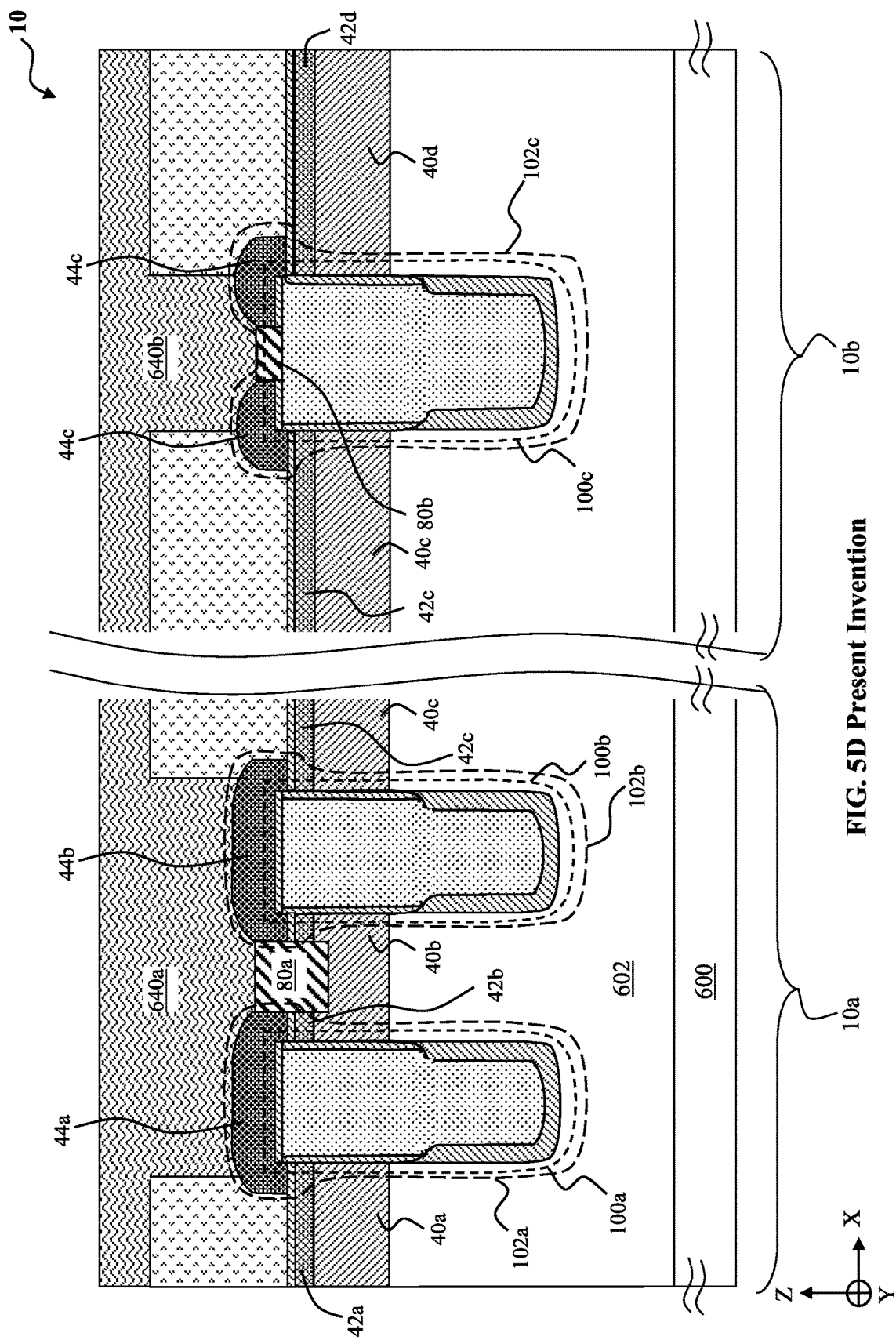
FIG. 5D Present Invention

HIGH DENSITY MOSFET ARRAY WITH SELF-ALIGNED CONTACTS DELIMITED BY NITRIDE-CAPPED TRENCH GATE STACKS AND METHOD

CROSS REFERENCE TO RELATED APPLICATIONS

This application is a divisional application of a co-pending U.S. Utility patent application Ser. No. 13/794,628. This application seeks priority to application Ser. No. 13/794,628 filed on Mar. 11, 2013 by a common inventor of this application; the entire content of the disclosure made in the application Ser. No. 13/794,628 is hereby incorporated by reference.

FIELD OF THE INVENTION

This invention relates generally to the field of semiconductor device structure. More specifically, the present invention is directed to device structure of a high density MOSFET array and its manufacturing method.

DESCRIPTION OF THE RELATED ART

Low voltage power MOSFETs are often used in load switching applications. In load switching applications it is desirable to reduce the on-resistance ($R_{ds}$) of the device. Specifically, the $R_{dsA}$ of the device needs to be minimized, where $R_{dsA}$ is the on-resistance of the device multiplied by the active area of the device. Additionally, low voltage power MOSFETs are commonly used in high frequency DC-DC conversion applications. In these applications it is often desirable to maximize the device's switching speed. Three of the most important parameters for optimizing the switching speed are: 1) $R_{ds} \times Q_g$; 2) $R_{ds} \times Qoss$; and 3) the ratio of $Q_{gd}/Q_{gs}$. First, the product of the $R_{ds}$ and the gate charge ($Q_g$) is a measure of the device conduction and switching losses together. $Q_g$ is the sum of the gate to drain charge ($Q_{gd}$) and the gate to source charge ($Q_{gs}$). In the second parameter, Qoss is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the body regions, and therefore causes an increase in the $R_{dsA}$. Also, the relatively thin gate oxide generates a high electric field under the trench, which leads to a lower breakdown voltage. Low doping concentrations are needed in the drift region in order to support the voltage, and this increases the $R_{dsA}$ for structures with thinner gate oxides. Further, as cell pitch continues to decrease for high device integration density, the trench based MOSFET may become a less desirable choice because of the difficulty in reducing the thickness of the gate oxide further.

Trench based MOSFETs with two-step gate oxide with a thin layer of oxide near the top of the gate and a thicker layer of oxide in the bottom portion of the gate were designed in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance. However, this device is not easily downwards scalable because it is highly susceptible to body contact misalignment errors. For example, if the pitch of the devices was scaled to the deep sub-micron level e.g., 0.5-0.6 μm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate an ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further away from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate power MOSFET devices with a deep sub-micron pitch that are optimized for use as load switches and high frequency DC-DC applications there is a need for a device and method capable of self-aligning the contacts to the gate in order to prevent the aforementioned side effects.

BRIEF DESCRIPTION OF THE DRAWINGS

The above and other objects, features and advantages of the present disclosure will become more apparent from the following detailed description made with reference to the accompanying drawings. In the drawings:

FIG. 1 illustrates a plane cross sectional view of a high density trench-gated MOSFET array of the present invention;

FIG. 2A, FIG. 2B, FIG. 2C and FIG. 3A illustrate the creation of active trenches in a MOSFET array area and a pickup trench in a gate pickup area of a semiconductor substrate;

FIG. 3B, FIG. 3C and FIG. 3D illustrate the creation, into the active trenches and the pickup trench, of numerous polysilicon trench gates each embedded in a gate oxide shell;

FIG. 3E, FIG. 4A, FIG. 4B, FIG. 4C, FIG. 4D, FIG. 4E illustrate the creation of an array of active nitride-capped trench gate stacks upon the active trenches, a pickup nitride-capped trench gate stack upon the pickup trench and successive implantation of body regions and source regions hence forming a MOSFET array in the MOSFET array area and a gate pickup structure in the gate pickup area; and FIG. 5A, FIG. 5B, FIG. 5C and FIG. 5D illustrate the deposition and patterning of dielectric regions atop the MOSFET array and the gate pickup structure and a metal layer atop the dielectric regions.

DETAILED DESCRIPTION OF THE PREFERRED EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1 illustrates a plane cross sectional view of a high density trench-gated MOSFET array 10 of the present invention. To facilitate description of spatial, structural relationships within the MOSFET array 10, an X-Y-Z Cartesian coordinate system with the X-Y plane parallel to the major semiconductor chip plane is employed. The high density trench-gated MOSFET array 10 has:

(1) A semiconductor substrate 600 lying parallel to the X-Y plane and the semiconductor substrate 600 is partitioned, in the X-Y plane, into a MOSFET array area 10a and a gate pick-up area 10b.

(2) An epitaxial region 602 overlaying the semiconductor substrate 600, body implant regions 40a, 40b, 40c, 40d overlaying the epitaxial region 602 and source implant regions 42a, 42b, 42c, 42d overlying the respective body implant regions 40a, 40b, 40c, 40d.

(3) An array of active nitride-capped trench gate stacks (ANCTGS) 102a, 102b plus a pickup nitride-capped trench gate stack (PNCTGS) 102c disposed at the top portion of the semiconductor substrate 600 and embedded vertically into the set of source regions 42a, 42b, 42c, 42d, the set of body regions 40a, 40b, 40c, 40d and the epitaxial region 602. While only two ANCTGS are illustrated here, by now for those skilled in the art the number of ANCTGS can be extended to more than two. Similarly, the number of PNCTGS can be extended to more than one. Importantly, the ANCTGS has predetermined inter-ANCTGS separations in the X-Y plane enabling the formation of the high density trench-gated MOSFET array 10 and this will be presently illustrated with more details. As for more structural detail, the ANCTGS 102a comprises a stack of:

(3a) A trench gate stack 100a having a polysilicon trench gate 342 embedded in a gate oxide shell (upper gate oxide 23a and lower gate oxide 24a) and a gate oxidation 27a on top.

(3b) A silicon nitride cap 44a covering the top of polysilicon trench gate 342. Importantly, the silicon nitride cap 44a is laterally registered, in the X-Y plane, to the gate oxide shell (upper gate oxide 23a and lower gate oxide 24a) such that in Z direction center lines of the silicon nitride caps 44a and 44b are substantially overlapping with center lines of corresponding gate oxide shell. In general, a width of the silicon nitride caps 44a and 44b is slightly larger than a width of a trench the gate lined with the gate oxide shell embedded in such that the nitride caps 44a and 44b extend beyond edges of the gate oxide shell to a controlled distance, e.g. between 0.02 to 0.2 micron depending on the cell density requirement. Therefore, the ANCTGS 102a forms, together with the source regions 42a, 42b, the body regions 40a, 40b, and the epitaxial region 602, a MOSFET device in the MOSFET array area 10a. Likewise, the similarly structured ANCTGS 102b (with trench gate stack 100b, polysilicon trench gate 342, upper gate oxide 23b, lower gate oxide 24b, gate oxidation 27b, silicon nitride cap 44b) forms, together with the source regions 42b, 42c, the body regions 40b, 40c, and the epitaxial region 602, another MOSFET device in the MOSFET array area 10a. As a feature of the high density trench-gated MOSFET array 10, the polysilicon trench gate 342 has an upper trench portion and a lower trench portion and, correspondingly, the gate oxide shell has an upper gate oxide 23a and a lower gate oxide 24a with thickness of the lower gate oxide 24a made larger than that of the upper gate oxide 23a. To those skilled in the art, this results in a desired reduction of gate-to-drain capacitance of the related MOSFET. In an alternative embodiment not shown here, the lower gate oxide 24a may be the same thickness as the upper gate oxide 23a to simplify the manufacturing process if such reduction of gate-to-drain capacitance is not required.

(4) Over both MOSFET array area 10a and gate pick-up area 10b, a patterned dielectric region 365 is formed atop the MOSFET array and a patterned metal layer 640a, 640b is formed atop the patterned dielectric region 365. Therefore, the patterned metal layer 640a, 640b forms, with the MOSFET array, self-aligned source and body contacts through the inter-ANCTGS separations.

(5) As for more structural detail, the PNCTGS 102c in the gate pick-up area 10b comprises a stack of:

(5a) A trench gate stack 100c having a polysilicon trench gate 342 embedded in a gate oxide shell (upper gate oxide 23c and lower gate oxide 24c) and a gate oxidation 27c on top. The polysilicon trench gate 342 of the PNCTGS 102c is routed, along an X-Y plane, to join the polysilicon trench gates 342 of the ANCTGS 102a and 102b.

(5b) A pair silicon nitride cap 44c covering the top of polysilicon trench gate 342. Except for its center gap, the pair silicon nitride cap 44c covers the top of polysilicon trench gate 342. Importantly, the center gap of the pair silicon nitride cap 44c is laterally registered, in the X-Y plane, to the gate oxide shell (upper gate oxide 23c and lower gate oxide 24c).

Therefore, the patterned metal layer 640b forms, through the center gap of the pair silicon nitride cap 44c, a self-aligned gate contact to the top of polysilicon trench gate 342.

As an artifact throughout the MOSFET array area 10a of the high density trench-gated MOSFET array 10, a pad oxide region 37a has been formed atop the source regions 42a, 42b but beneath the silicon nitride caps 44a, 44b. Similarly, as another artifact throughout the gate pick-up area 10b of the high density trench-gated MOSFET array 10, a pad oxide region 37b has been formed atop the source regions 42c, 42d but beneath the pair silicon nitride cap 44c. More remarks on these artifacts 37a, 37b will be given later.

As another feature of the high density trench-gated MOSFET array 10, at the contact interface between the patterned metal layer 640a and the source and body contact, a contact enhancement plug 80a can be added for improving the quality and reliability of the contact interface. Similarly, at the contact interface between the patterned metal layer 640b and the PNCTGS 102c, a contact enhancement plug 80b can be added for improving the quality and reliability of the contact interface as well. For example, the contact enhancement plugs 80a and 80b can be made of tungsten (W). As shown in FIG. 1, conductive materials filling a gate contact hole for electrically connect to the gate region. The gate contact hole includes a wide opening through the dielectric layer 365 above the pair silicon nitride cap 44c exposing at least portion of the of pair silicon nitride cap 44c and the gap between the pair silicon nitride cap. The gate contact hole further includes a narrow opening in the gap of pair silicon nitride cap 44c. The contact enhancement plug 80b fills at least a bottom portion of the narrow opening with a width of in the gap of the pair silicon nitride cap and the patterned metal layer 640b fills a top portion of the narrow opening and the entire wide opening.

FIG. 2A through FIG. 5D illustrate the processing steps for making the high density trench-gated MOSFET array 10 of the present invention. FIG. 2A, FIG. 2B, FIG. 2C and FIG. 3A illustrate the creation of active trenches in a MOSFET array area and a pickup trench in a gate pickup area of a semiconductor substrate.

FIG. 2A illustrates the formation of an epitaxial region 602 (for example of an N−conductivity type) upon a semiconductor substrate 600 (for example of an N+conductivity type) then partitioning the device in progress, along its top X-Y plane, into a MOSFET array area 10a and a gate pick-up area 10b. A hard oxide mask 304 made of silicon dioxide is then deposited atop the device in progress.

In FIG. 2B the hard oxide mask 304 is photolithographically patterned into a patterned hard mask 305 according to a pre-determined cross sectional trench top geometry (X-Y plane) of upper active trenches in the MOSFET array area 10a and a pre-determined cross sectional trench top geometry (X-Y plane) of pickup trench in the gate pick-up area 10b.

FIG. 2C through FIG. 3A illustrate the creation of an array of active trenches in the MOSFET array area 10a and a pickup trench in the gate pick-up area 10b with the active trenches and the pickup trench extending a predetermined total trench depth TCD partially into the epitaxial region 602. In FIG. 2C upper trenches 12a, 12b, 12c with an upper trench width ($UTW_a$, $UTW_b$, $UTW_c$) and an upper trench depth (UTD) are anisotropically etched out through the patterned hard mask 305. The UTD is achieved with pre-determined etching rate and etching time. As an important remark, the width ($UTW_c$) of pickup trench 12c is made substantially wider than those ($UTW_a$, $UTW_b$) of the active trenches 12a, 12b such that in following nitride cap formation steps, a gap of minimum width is provided for metal contact to the gate. For example, $UTW_c$ may be as wide as two times of $UTW_a$. In a preferred embodiment $UTW_a$ is selected between 0.2 to 0.6 micron and $UTW_c$ is 0.4 micron or larger. In FIG. 3A pad oxide layer 20a, 20b, 20c, of thickness POTK, are grown atop the silicon surface at the sidewall and bottom of the upper trenches 12a, 12b, 12c. A thin nitride spacer layer 22a, 22b, 22c, of thickness NSTK, is then formed upon the pad oxide layer 20a, 20b, 20c. Next, the bottom portion of the nitride spacer layer 22a, 22b, 22c and the pad oxide layer 20a, 20b, 20c are anisotropically etched out to expose the bottom of the upper trenches 12a, 12b, 12c. Lower trenches 14a, 14b, 14c can then be anisotropically etched out into the epitaxial region 602, through the exposed bottom of the upper trenches 12a, 12b, 12c. As a result, the lower trenches 14a, 14b, 14c have a lower trench width ($LTW_a$, $LTW_b$, $LTW_c$) and a lower trench depth (LTD) with the resulting lower trench width<upper trench width. The LTD is achieved with pre-determined etching rate and etching time.

FIG. 3B through FIG. 3D illustrate the creation, into the active trenches and the pickup trench, of numerous polysilicon trench gates each embedded in a gate oxide shell. In FIG. 3B a liner oxide layer 21a, 21b, 21c is grown on the silicon surface of the lower trenches 14a, 14b, 14c with thickness of the liner oxide layer>that of the pad oxide layer 20a, 20b, 20c (POTK). In FIG. 3C the nitride spacer layer and the pad oxide layer in the upper trenches are completely removed, for example through a wet dip etching, with a corresponding reduction of the thickness of the liner oxide layer 21a, 21b, 21c in the lower trenches 14a, 14b, 14c. In FIG. 3D an upper gate oxide shell 23a, 23b, 23c is grown on the silicon surface of the upper trenches upon the device in progress resulting in a corresponding lower gate oxide shell 24a, 24b, 24c thicker than that of a corresponding upper gate oxide shell. All the trenches (12a-12c, 14a-14c) in the MOSFET array area 10a and the gate pick-up area 10b are then filled with polysilicon deposition followed by polishing top of the device in progress. This completes a polysilicon trench gate 342 embedded in a gate oxide shell (23a, 23b, 23c and 24a, 24b, 24c). Recall that, because lower trench width ($LTW_a$, $LTW_b$, $LTW_c$)<upper trench width ($UTW_a$, $UTW_b$, $UTW_c$) it follows that the thickness of a corresponding lower gate oxide shell (24a, 24b, 24c)>that of a corresponding upper gate oxide shell (23a, 23b, 23c). To those skilled in the art, this effects a desired reduction of gate-to-drain capacitance of the related MOSFET.

FIG. 3E, FIG. 4A, FIG. 4B, FIG. 4C, FIG. 4D, FIG. 4E illustrate the creation of an array of active nitride-capped trench gate stacks upon the active trenches, a pickup nitride-capped trench gate stack upon the pickup trench and successive implantation of body regions and source regions hence forming a MOSFET array in the MOSFET array area 10a and a gate pickup structure in the gate pick-up area 10b. FIG. 3E illustrates etching, through the patterned hard mask 305, the polysilicon trench gate 342 till a depth of trench gate recess depth (TGRD) with the TGRD less than the thickness of the patterned hard mask 305 thus creating a trench gate recess 25a, 25b, 25c. A gate oxidation layer 27a, 27b, 27c is then grown into the poly-silicon trench gate 342.

FIG. 4A illustrates the deposition then dry etching into a silicon nitride cap seed 35a, 35b, 35c upon the gate oxidation layer 27a, 27b, 27c till the silicon nitride cap seed 35a, 35b, 35c just fills up the trench gate recess 25a, 25b, 25c at the upper trenches 12a, 12b, 12c whereas, as the pickup upper trench 12c is substantially wider than those of the active upper trenches 12a, 12b ($UTW_c$>>$UTW_a$, $UTW_b$) the silicon nitride cap seed 35c only partially fills up the trench gate recess 25c at the pickup upper trench 12c around its periphery. To more clearly illustrate dry etching into the silicon nitride cap seed 35a, a number of interim, progressive dry etching surface profiles 3501a, 3502a, 3503a are added in the upper left inset. Likewise, to more clearly illustrate dry etching into the silicon nitride cap seed 35c, a number of interim, progressive dry etching surface profiles 3501c, 3502c, 3503c are added in the upper right inset.

In FIG. 4B the patterned hard oxide mask 305 is stripped off thus causing the silicon nitride cap seeds 35a, 35b, 35c to protrude, with edges of protrusion in inherent registration with the upper gate oxide shell 23a, 23b, 23c, above top surface of the device in progress. Next, a pad oxide region 37a, 37b, 37c, 37d is then grown on top silicon surface of the device in progress.

FIG. 4C illustrates: 1) Implanting, with a body mask and through the pad oxide region 37a, 37b, 37c, 37d, body implant regions 40a, 40b, 40c, 40d embedded into the top portion of the epitaxial region 602 while protecting the semiconductor surface from an implantation-induced damage with the pad oxide region 37a, 37b, 37c, 37d. 2) Implanting, with a source mask and through the pad oxide region 37a, 37b, 37c, 37d, source implant regions 42a, 42b, 42c, 42d embedded into the top portion of the epitaxial region 602 and atop the body implant regions 40a, 40b, 40c, 40d while protecting the semiconductor surface from an implantation-induced damage with the pad oxide region 37a, 37b, 37c, 37d. As a preferred embodiment, thickness of the body region may range from 0.3 micron to 0.7 micron and thickness of the source region may range from 0.1 micron to 0.2 micron. As a related remark on the pad oxide region 37a, 37b, 37c, 37d, while it serves to protect the semiconductor surface from an implantation-induced damage and from a later silicon nitride deposition step, the pad oxide region 37a, 37b, 37c, 37d does not provide any function in the finished device, so the pad oxide region 37a, 37b, 37c, 37d can optionally be removed as an artifact with another process step following the final silicon nitride deposition.

FIG. 4D and FIG. 4E illustrate subjecting the device in progress to a cycle of aerially uniform silicon nitride deposition (FIG. 4D) and silicon nitride etching (FIG. 4E), each with pre-determined deposition rate and deposition time interval. To more clearly illustrate silicon nitride deposition, a number of interim, progressive dry deposition surface profiles 3601a, 3602a, 3603a, 3601c, 3602c, 3603c are added in FIG. 4D. To more clearly illustrate silicon nitride etching, a number of interim, progressive dry etching surface profiles 4401a, 4402a, 4401c, 4402c are added as insets in FIG. 4E. Thus, owing to the protrusion of the silicon nitride cap seeds 35a, 35b, the silicon nitride cap seeds 35a, 35b are grown into silicon nitride caps 44a, 44b. Meanwhile, owing to the protrusion of the silicon nitride cap seed 35c, the silicon nitride cap seed 35c is grown into a pair silicon nitride cap 44c. To those skilled in the art, therefore, an array of active nitride-capped trench gate stacks (ANCTGS) 102a, 102b have been created in the MOSFET array area 10a and a pickup nitride-capped trench gate stack (PNCTGS) 102c has been created in the gate pick-up area 10b. Importantly, the ANCTGS has predetermined inter-ANCTGS separations in the X-Y plane enabling the formation of a high density trench-gated MOSFET array with self-alignment of source and body contacts. This is because all the silicon nitride caps 44a, 44b are laterally registered, in the X-Y plane, to their closest upper gate oxide shells. Additionally, although less important, the same process of the present invention simultaneously realizes self-alignment of gate contact in the gate pick-up area 10b.

FIG. 5A, FIG. 5B, FIG. 5C and FIG. 5D illustrate the deposition and patterning of dielectric regions atop the MOSFET array and the gate pickup structure and a metal layer atop the dielectric regions. FIG. 5A and FIG. 5B illustrate the formation and patterning of a patterned dielectric region 365 (e.g., made of reflow LTO/BPSG (low temperature oxide/borophosphosilicate glass)). The patterned dielectric region 365 has a gate contact opening 60 atop the PNCTGS 102c thus exposing the pad oxide region 37c beneath the center gap of the pair silicon nitride cap 44c. The exposed pad oxide region 37c is then etched away.

In FIG. 5C a patterned hard mask 630a, 630b is formed and patterned atop the device in progress. The patterned hard mask 630a, 630b has a source/body contact opening 70 directly over the ANCTGS 102a, 102b thus exposing a corresponding portion of the patterned dielectric region 365. The corresponding portion of the patterned dielectric region 365 is then etched away thus exposing a portion of the pad oxide region 37a delimited by the two silicon nitride caps 44a and 44b. The exposed delimited portion of the pad oxide region 37a is then etched away followed by anisotropic etching through the source implant region 42b and partially into the body implant region 40b thus creating a self-aligned contact opening 48 for making source and body contacts. As a result, the corresponding dimensions spacing A (SP-A), spacing B (SP-B) and MOSFET device pitch of the high density trench-gated MOSFET array 10 can be made very small.

FIG. 5D illustrates the completed high density trench-gated MOSFET array 10 following a final deposition of metal layer 640a, 640b. As another optional feature of the present invention, contact enhancement plugs 80a, 80b can be formed at the contact interface between the metal layer 640a, 640b and the source, body and gate regions, prior to the final deposition of metal layer 640a, 640b, for improving the quality and reliability of these contact interfaces. The contact enhancement plugs 80a, 80b can be made of tungsten (W). In a preferred embodiment, a thin titanium/titanium nitride (Ti/TiN) barrier metal layer is deposited followed by the deposition of tungsten (W) with thickness of the resulting contact enhancement plug ranging from 2000 to 4000 Angstrom.

While by now it should be understood that the present invention can be practiced with a large range of numerous device geometrical parameters, the following list some geometrical parameters under a preferred embodiment:

Silicon nitride cap 44a, 44b has a width of 0.3-1 micron and a thickness of 1000-5000 Angstrom resulting in a device pitch of 0.4 micron-1.2 micron in the MOSFET array. Pair silicon nitride cap 44c has a width (outer edge to outer edge) of 0.5-1.6 micron and a thickness of 1000-5000 Angstrom.

Pad oxide region 37a, 37b, 37c, 37d has a thickness of 100-300 Angstrom.

For the polysilicon trench gate 342 in the MOSFET array area 10a:
  its upper trench portion has a width of 0.2 micron-0.3 micron, a depth of 0.3 micron-0.6 micron.
  its lower trench portion has a depth of 0.3 micron-0.6 micron.
  the upper gate oxide shell has a thickness of 100-600 Angstrom while the lower gate oxide shell has a thickness of 300-1000 Angstrom.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A high density trench-gated MOSFET device comprising:
    a semiconductor substrate;
    an epitaxial region overlaying the semiconductor substrate, a body region overlying the epitaxial region and a source region overlying the body region;

an array of active nitride-capped trench gate stacks (AN-
CTGS), with inter-ANCTGS separations, disposed
above the semiconductor substrate and embedded ver-
tically into the source region, the body region and the
epitaxial region, wherein each ANCTGS comprises a
stack of a polysilicon trench gate embedded in a gate
oxide shell and a silicon nitride cap covering a top
surface of the polysilicon trench gate, wherein portions
of the silicon nitride cap disposed on the top surface of
the polysilicon trench gate is separated from the poly-
silicon trench gate, and laterally extending over edges
of the gate oxide shell whereby forming, together with
the source region, the body region and the epitaxial
region, a MOSFET array;
a patterned dielectric region atop the MOSFET array and
a patterned metal layer atop the patterned dielectric
region whereby the patterned metal layer forms, with
the MOSFET array, a plurality of self-aligned source
and body contacts through the inter-ANCTGS separa-
tions, wherein the top surface of the polysilicon trench
gate extending to both sides of the gate oxide shell is
above a top surface of the source region; and
a gate pickup area comprising:
  a pickup nitride-capped trench gate stack (PNCTGS)
  disposed above the semiconductor substrate and
  embedded vertically into the epitaxial region,
  wherein the PNCTGS comprises a stack of polysili-
  con trench gate embedded in a gate oxide shell,
  wherein the polysilicon trench gate of the PNCTGS
  is routed to join the polysilicon trench gate of each
  ANCTGS; and
  a pair silicon nitride cap with a center gap laterally
  registered to the gate oxide shell, the pair silicon
  nitride cap covers, except for the center gap, the top
  surface of the polysilicon trench gate whereby the
  patterned metal layer forms, through the center gap,
  a self-aligned gate contact to the top surface of
  polysilicon trench gate;
wherein the patterned metal layer contacts a top surface of
  the pair silicon nitride cap;
wherein a bottom surface of the patterned dielectric
  region is directly attached to a pad oxide region atop the
  source region;
wherein a portion of the pad oxide region is beneath the
  silicon nitride cap;
wherein the patterned dielectric region and the pad oxide
  region are made of different materials;
wherein the patterned dielectric region is directly attached
  to the silicon nitride cap; and
wherein a top surface of the patterned dielectric region is
  directly attached to the patterned metal layer.
2. The trench-gated MOSFET device of claim 1 further
comprising:
  atop the source region but beneath each silicon nitride
  cap, a pad oxide region throughout an area of the
  MOSFET array; and
  atop the source region but beneath the pair silicon nitride
  cap, another pad oxide region throughout the gate
  pickup area.
3. The trench-gated MOSFET device of claim 2, wherein
each silicon nitride cap of ANCTGS has a width of 0.3 to 1
micron and a thickness of 1000 to 5000 Angstroms, and
wherein the pair silicon nitride cap of PNCTGS has a width
of 0.5 to 1.6 microns measured from outer opposite edges
across the center gap and a thickness of 1000 to 5000
Angstroms.

4. The trench-gated MOSFET device of claim 1 further
comprising:
  at a contact interface between the patterned metal layer
  and the source and body contacts, a first contact
  enhancement plug for improving quality and reliability
  of the contact interface between the patterned metal
  layer and the source and body contacts; and
  at a contact interface between the patterned metal layer
  and the PNCTGS, a second contact enhancement plug
  for improving quality and reliability of the contact
  interface between the patterned metal layer and the
  PNCTGS.
5. The trench-gated MOSFET device of claim 4, wherein
the first contact enhancement plug has a thickness of to 4000
Angstroms and comprises a titanium/titanium nitride (Ti/
TiN) barrier layer and a tungsten (W) layer atop the Ti/TiN
barrier layer.
6. The trench-gated MOSFET device of claim 1, wherein
the polysilicon trench gate has an upper trench portion and
a lower trench portion, and the gate oxide shell has an upper
gate oxide shell and a lower gate oxide shell, a thickness of
the lower gate oxide shell is larger than that of the upper gate
oxide shell, whereby effecting a desired reduction of gate-
to-drain capacitance of a corresponding MOSFET.
7. The trench-gated MOSFET device of claim 6, wherein
  the upper trench portion of the polysilicon trench gate in
    the area of the MOSFET array has a width of 0.2 to 0.3
    micron and a depth of 0.3 to 0.6 micron;
  the lower trench portion of the polysilicon trench gate in
    the area of the MOSFET array has a depth of 0.3 to 0.6
    micron;
  the upper gate oxide shell has a thickness of 100 to 600
    Angstroms; and
  the lower gate oxide shell has a thickness of 300 to 1000
    Angstroms.
8. The trench-gated MOSFET device of claim 1, wherein
  the silicon nitride cap is directly attached to an upper
  portion of the gate oxide shell.
9. The trench-gated MOSFET device of claim 8, wherein
the patterned dielectric region is directly attached to the pair
silicon nitride cap.
10. The trench-gated MOSFET device of claim 9, wherein
the pair silicon nitride cap is directly attached to an upper
portion of the gate oxide shell of the PNCTGS.
11. The trench-gated MOSFET device of claim 10,
wherein portions of the pair silicon nitride cap disposed on
the top surface of the polysilicon trench gate of each
PNCTGS is separated from the polysilicon trench gate of
each PNCTGS, and laterally extending over edges of the
gate oxide shell.
12. The trench-gated MOSFET device of claim 11,
wherein bottom surfaces the portions of the pair silicon
nitride cap separated from the polysilicon trench gate of
each PNCTGS are at a position lower than a bottom surface
of another portion of the silicon nitride cap of each PNCTGS
directly attached to the polysilicon trench gate.
13. The trench-gated MOSFET device of claim 1, wherein
bottom surfaces the portions of the silicon nitride cap
separated from the polysilicon trench gate are at a position
lower than a bottom surface of a center portion of the silicon
nitride cap directly attached to the polysilicon trench gate.
14. The trench-gated MOSFET device of claim 1, wherein
a contact enhancement plug fills at least a bottom portion of
the center gap of the pair silicon nitride cap and wherein the
patterned metal layer fills a top portion of the center gap of
the pair silicon nitride cap.

* * * * *